US011270764B2

(12) United States Patent
Cong et al.

(10) Patent No.: US 11,270,764 B2
(45) Date of Patent: Mar. 8, 2022

(54) TWO-BIT MEMORY CELL AND CIRCUIT STRUCTURE CALCULATED IN MEMORY THEREOF

(71) Applicant: Nanjing UCUN Technology Inc, Nanjing (CN)

(72) Inventors: Wei Cong, Nanjing (CN); Seow Fong Lim, Nanjing (CN)

(73) Assignee: NANJING UCUN TECHNOLOGY INC, Nanjing (CN)

( * ) Notice: Subject to any disclaimer, the term of this patent is extended or adjusted under 35 U.S.C. 154(b) by 0 days.

(21) Appl. No.: 17/365,841

(22) Filed: Jul. 1, 2021

(65) Prior Publication Data
US 2022/0005525 A1    Jan. 6, 2022

(30) Foreign Application Priority Data

Jul. 2, 2020 (CN) .......................... 202010628862.4

(51) Int. Cl.
*G06N 3/02* (2006.01)
*G11C 11/56* (2006.01)
(Continued)

(52) U.S. Cl.
CPC ................ *G11C 11/56* (2013.01); *G06N 3/02* (2013.01); *G11C 7/1051* (2013.01);
(Continued)

(58) Field of Classification Search
CPC ..... G11C 11/56; G11C 7/1051; G11C 7/1078; G11C 7/18; G11C 8/08; G11C 8/14; G11C 16/0483; G06N 3/02
See application file for complete search history.

(56) References Cited

U.S. PATENT DOCUMENTS 9,166,063 B2 * 10/2015 Kwon ............... H01L 29/40117
9,430,735 B1 * 8/2016 Vali .......................... G06N 3/04
(Continued)

FOREIGN PATENT DOCUMENTS

CN     105895636 A     8/2016
CN     111523658 A     8/2020

OTHER PUBLICATIONS

First Chinese Office Action issued in Chinese application No. CN2020106288624 dated Aug. 14, 2020, 13 pages.
(Continued)

*Primary Examiner* — Khamdan N. Alrobaie
(74) *Attorney, Agent, or Firm* — MH2 Technology Law Group, LLP

(57) ABSTRACT

The invention relates to a two-bit memory cell structure, and an array architecture and a circuit structure thereof in an in-memory computing chip. The double-bit storage unit comprises three transistors which are connected in series, a selection transistor in the middle is used as a switch, and two charge storage transistors are symmetrically arranged on the two sides of the double-bit storage unit. A storage array formed by the double-bit storage unit is used for storing the weight of the neural network, and multiplication and accumulation operation of the neural network is carried out in a two-step current detection mode. According to the invention, leakage current can be effectively controlled, higher weight storage density and higher reliability are realized, and neural network operation with more practical significance is further realized.

11 Claims, 5 Drawing Sheets

(51) Int. Cl.
    *G11C 7/10*           (2006.01)
    *G11C 7/18*           (2006.01)
    *G11C 8/08*           (2006.01)
    *G11C 8/14*           (2006.01)
    *G11C 16/04*         (2006.01)

(52) U.S. Cl.
    CPC .............. *G11C 7/1078* (2013.01); *G11C 7/18* (2013.01); *G11C 8/08* (2013.01); *G11C 8/14* (2013.01); *G11C 16/0483* (2013.01)

(56) References Cited

U.S. PATENT DOCUMENTS

| | | | |
|---|---|---|---|
| 2003/0021167 A1* | 1/2003 | Kamei | G11C 16/0491 365/200 |
| 2007/0047309 A1* | 3/2007 | Satoh | G11C 16/16 365/185.17 |
| 2014/0133245 A1 | 5/2014 | Satoh et al. | |
| 2016/0240542 A1 | 8/2016 | Kwon | |
| 2018/0285727 A1* | 10/2018 | Baum | G06F 9/30054 |
| 2019/0130258 A1* | 5/2019 | Gappy | G06N 3/063 |
| 2019/0147328 A1* | 5/2019 | Burr | G11C 11/401 706/25 |
| 2021/0166108 A1* | 6/2021 | Lee | G11C 16/0483 |

OTHER PUBLICATIONS

Second Chinese Office Action issued in Chinese application No. CN2020106288624 dated Sep. 16, 2020, 14 pages.
Third Chinese Office Action issued in Chinese application No. CN2020106288624 dated Oct. 10, 2020, 12 pages.

* cited by examiner

TWO-BIT MEMORY CELL AND CIRCUIT STRUCTURE CALCULATED IN MEMORY THEREOF

CROSS-REFERENCE TO RELATED APPLICATION(S)

This application claims priority under 35 U.S.C. § 119 from Chinese Patent Application No. 202010628862.4, filed on Jul. 2, 2020, in the China National Intellectual Property Administration ("CNIPA"), the entire contents of which are incorporated herein by reference.

TECHNICAL FIELD

The present invention relates to the field of circuits design of memory cells and in-memory computing chip, and more particularly to a two-bit memory cell structure, a memory array architecture based on the two-bit memory cell structure, and a circuit architecture thereof applied in the field of in-memory computing.

BACKGROUND

As one of the perception models with the most advanced level in the field of artificial intelligence, deep neural network simulates the neural connection structure of human brain by establishing a model, describes data processing features layer by layer by means of multiple transforming stages; and it brings a breakthrough progress for processing large scale data such as image, video, audio and the like. The deep neural network model is an operation model, which consists of a large number of nodes called neurons interconnecting each other to form a network. The strength of a connection between every two nodes is denoted with a weighted proportion, namely weight, of a connection signal between the two nodes, and corresponds to a memory in a human neural network. A connection relationship between any adjacent neuron layers in a plurality of neuron layers above mentioned is determined by a weight parameter; and the connection methods may include full connection, random connection, convolution connection and the like.

In the prior art, the neural network has the problems of slow processing speed, high operation power consumption and the like. The reasons are: deep learning technology relies on a large amount of computation; when computation parallelism keeps increasing, the bandwidth required for transmitting data limits the computing speed, which is usually called the Von Neumann bottleneck; furthermore, with the development of technology and Moore's law, the power consumption of a computing unit becomes lower and lower, while on the other hand, the proportion of the consumed power for reading and writing a memory constantly rises; and the contradiction between computing and storage is increasingly prominent. In order to overcome the defects caused by the conventional Von Neumann structure, computing in memory (CIM) becomes an attractive method to solve the problem. Computing in memory does not need to transmit data to a processor, but directly performs computation in memory, thereby greatly reduces the energy consumption for data accessing during computing, and improves the computing speed and energy efficiency.

In a CIM integrated circuit, a module for computing the neural network generally consists of a memory array. Taking a resistive memory model as an example, during specific operation, a signal vector to be processed is inputted into the memory array storing weight parameters for processing, and the computation process corresponds to bias reading of the memory cell storing the weight parameters. Processing the signal by the memory array is equivalent to completing the propagation from one neuron layer of the neural network to the next neuron layer; and so on, after a plurality of memory arrays are connected, the computation of a multi-layer neural network can be executed.

The existing memory array technology includes RAM (random access memory) and NVM (non-volatile memory). The advantage of adopting the random access memory is quick reading and computing speeds; and the advantage of adopting the NVM is that the stored weight signal can be retained in case of power down, thereby saving the time and power consumption for loading a model when the system is started.

At present, the NVM technologies used for researching and developing the computing in memory in academia and industry include RRAM, MRAM, SONOS device, floating gate (FG) memory device and the like. The main challenge these technologies faced is how to reduce the power consumption, while considering the weight storage density and the weight storage reliability. RRAM technology adopts a 1T1R (one transistor and one rheostat) structure, thereby having a low storage density in the same IC area. MRAM technology adopts a 1T-1MTJ (one transistor and one magnetic tunnel junction) structure, and only includes two configurations: high or low resistance values. Therefore, the weight expression and computation capabilities in neural network computing are limited.

The existing in-memory computing circuit based on the SONOS or floating gate technology stores weights by means of charge trapping in a transistor. However, when the bit width of a weight is too high or the weight has been erased for many times in the memory, the memory cell thereof suffer serious reliability problems, such as erasure interference, leakage current due to over erase and the like which affect the power consumption, operation accuracy and reliability of a neural network system.

CONTENT OF THE PRESENT INVENTION

In order to solve the problem in the prior art, the present invention provides a two-bit memory cell including a control transistor and two charge storage transistors, and further provides applying the memory array consisting of the two-bit memory cells to store weights of a neural network, and perform multiply accumulate operation on the neural network with a two-step current detection method. The present invention can effectively reduce leakage current in the memory array, realizes higher weight storage density and higher reliability, and realizes a neural network operation with more practical scheme.

The objective of the present application and the technical problem solved thereby are implemented by adopting the following technical solution: a two-bit memory cell structure, wherein the two-bit memory cell comprises three transistors in series, in which the middle transistor is a select transistor used as a switch, and a first charge storage transistor and a second charge storage transistor are symmetrically disposed on two sides of the select transistor; gate electrodes of the first charge storage transistor and the second charge storage transistor are connected to respective word lines, and the drain side of the first charge storage transistor and the source side of the second charge storage transistor are respectively connected to the cell bit line and the cell source line; while the source side of the first charge storage transistor and the drain side of the second charge storage transistor are respectively connected to the drain side and the source side of the select transistor.

The cell bit line and the cell source line are completely exchangeable during operation and form symmetric cells after exchange, in which the drain side of the first charge storage transistor and the source side of the second charge storage transistor are respectively connected to the cell source line and the cell bit line while the source side of the first charge storage transistor and the drain side of the second charge storage transistor are respectively connected to the drain side and the source side of the select transistor; a two-bit memory cell and its adjacent symmetric cell form a cell pair group.

In the embodiment of the present application, the select transistor is a field effect transistor; the first charge storage transistor and the second charge storage transistor are two-level or multi-level storage transistors, and the first charge storage transistor and the second charge storage transistor can be selected from but not limited to the following storage transistor structures: a charge trapping ONO flash memory transistor structure, a floating gate flash memory structure transistor, a resistive random access memory (RRAM), a magnetic random access memory (MRAM), and a ferromagnetic random access memory (FeRAM).

In the embodiment of the present application, during write operation, a positive voltage is applied to the word line of the target charge storage transistor and a negative voltage is applied to the cell P well, and electrons are injected into the storage layer under the voltage difference; a negative voltage is applied to the word line of the other charge storage transistor to remain an equilibrium electric potential with the P well; and a positive switching voltage is applied to the word line of the select transistor in the cell to keep the select transistor on.

In the embodiment of the present application, during erase operation, a negative voltage is applied to both the word lines of the first and the second charge storage transistors and a positive voltage is applied to the cell P well, and electrons are synchronously erased from the storage layers of the two storage transistors under the positive-negative voltage difference; in the process, the word line of the select transistor in the cell can be selected to be on or off.

In the embodiment of the present application, during read operation, a positive voltage is applied to the word line of the select transistor to keep the transistor on; a positive override voltage is applied to the word line of the charge storage transistor conjugated with the reading target charge storage transistor, so as to override the charge storage transistor; the voltage value of the positive override voltage is greater than the value of the highest point in the threshold voltage distribution of the storage bits, and is less than half of the write voltage.

In the embodiment of the present application, a circuit architecture using two-bit memory cell is used for computing in memory, wherein the memory cell array consisting of the two-bit memory cell structures above is applied for storing weights, the two-bit memory cell in the same column of the memory cell array corresponds to various connections of the same neural node, and the two-bit memory cells in the same column are connected in series; the charge storage transistors on the same word line signal line in the same row form a storage page; the same storage page stores weights with the same sign, and all the storage pages are divided into two groups; input terminals in the same column of the memory cell array are connected to a high voltage page buffer circuit, so as to provide a signal input of voltage bias for configuring a weight array; and output terminals are connected to a multiplexer for performing decoding selection, in which an output terminal of the multiplexer is connected to a two-stage readout circuit, and the two-stage readout circuit includes a charge capacitor, a current calculator, and a current comparison amplifier. The current calculator comprises a current adder, a current subtracter, a multiplication amplifier, and a combination thereof.

In the present application, in a neural network matrix operation adopting positive and negative weights, the positive and negative weights are stored in different weight page groups. The output terminal of the multiplexer detects currents of all the positive weight page group and stores electric charges in a capacitor; and after the drain electrode and the source electrode are exchanged, the output terminal detects currents of all the negative weight page group and stores the currents in another capacitor; the current subtracter outputs a current difference between the two groups of currents, and the current difference and a reference current are inputted together into the current comparison amplifier to generate a digital output value of the multiplier accumulator.

In the present application, in a neural network matrix operation adopting all positive or all negative weights, the output terminal of the multiplexer detects currents of all the first weight page group and stores electric charges in a capacitor; and after the drain electrode and the source electrode are exchanged, the output terminal detects currents of all the second weight page group and stores the currents in another capacitor; the current adder outputs a current sum of the two groups of currents, and the current sum and a reference current are inputted together into the current comparison amplifier to generate a digital output value of the multiplier accumulator.

In the present application, in a neural network matrix operation adopting all positive or all negative long bit width weights, the upper bits and lower bits are stored in the two storage page groups; the output terminal of the multiplexer detects all the currents of the upper bits weight storage page group, and amplifies the upper bits current by means of the multiplication amplifier, and stores electric charges in a capacitor; and after the drain electrode and the source electrode are exchanged, the output terminal detects all the currents of the lower bits weight storage page group, and stores the currents in another capacitor; the current adder outputs a current sum of the two groups of currents, and the current sum and a reference current are inputted together into the current comparison amplifier to generate a digital output value of the multiplier accumulator.

The present invention provides a two-bit memory cell and a circuit structure that the two-bit memory cell is used for computing in memory. The circuit structure adopts a three-transistor two-bit cell structure, which can prevent over-erase by means of the on and off of the select transistor and can effectively control the leakage currents of write, erase and read, thereby reducing weight storage and operation power consumption; furthermore, the present invention can precisely control energy level of programming, support multi-bit weight storage, thereby remarkably improving the output precision and reliability of the multiplier accumulator (MAC). The weight memory cell array consisting of the two-bit memory cell structures adapts to the design of a neural network chip; the present invention can improve the density of the stored weight data by increasing the number of layers of the memory array, and can further increase the number of connections of the neural network on each unit of chip area.

DESCRIPTION OF SYMBOLS 100, two-bit memory cell; 110, select transistor; 120, first charge storage transistor; 130, second charge storage transistor; WL, WLS0, and WLS1, word line; BL, cell bit line; SL, cell source line; 200, high voltage page buffer circuit; 310, current subtracter; 320, current adder; 330, multiplication amplifier; 400, current comparison amplifier; 500, multiplexer; 610, positive weight page group; 620, negative weight page group; 630, first weight page group; 640, second weight page group; 650, upper-bits weight storage page group; and 660, lower-bits weight storage page group.

DETAILED DESCRIPTION OF THE PREFERRED EMBODIMENT

To enable persons skilled in the art to better understand the solution of the present invention, the technical solutions in the embodiments of the present invention will be clearly and completely described hereafter with reference to the drawings in the embodiments of the present invention. It is apparent that the described embodiments are only a part of the embodiments of the present invention, but not the whole. Based on the embodiments in the present invention, all the other embodiments obtained by a person skilled in the art without involving an inventive effort should be all concluded in the protection scope of the present invention.

It should be noted that the terms "comprise" and "include" and any variations thereof in the specification, claims and drawings of the present invention are intended to cover non-exclusive inclusions. For example, a process, a method, an apparatus, a product, or a device that contains a series of steps or units is not necessarily limited to the steps or units explicitly listed, and may instead include other steps or units not explicitly listed or inherent to the process, method, product, or device.

Figure 1:
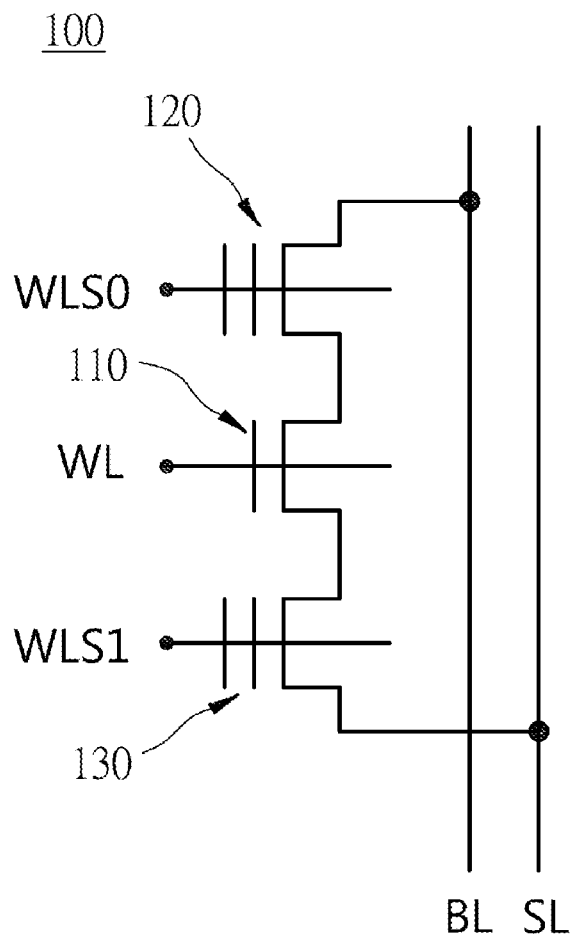
FIG. 1 is a schematic view of a two-bit memory cell structure according to the present invention.

FIG. 1 is a schematic view of a two-bit memory cell structure according to the present invention. In the embodiment of the present invention, provided is a two-bit memory cell structure of a non-volatile flash memory; each two-bit memory cell 100 comprises three transistors in series, in which the middle transistor is a select transistor 110 used as a select gate switch of the two-bit memory cell 100; transistors on two sides of the select transistor 110 are a first charge storage transistor 120 and a second charge storage transistor 130 which are symmetrically disposed.

The select transistor 110 is a select gate field effect transistor, implemented by a standard metal oxide semiconductor field effect transistor (MOSFET) technology. The first charge storage transistor 120 and the second charge storage transistor 130 are charge storage field effect transistors. The first charge storage transistor and the second charge storage transistor are two-level or multi-level storage transistors, and can be a floating gate memory cell, a split gate floating gate memory cell, a dielectric charge trapping memory cell (for example, a SONOS device, or other types of dielectric charge trapping cells such as BE-SONOS and TANOS), and a split gate dielectric charge trapping memory cell, or the technology structures such as a resistive random access memory (RRAM), a magnetic random access memory (MRAM), a ferromagnetic random access memory (FeRAM) and the like. The specific forms of charge storage transistors will not be described in detail here in case that the main points of the present invention are confused.

Figure 2:
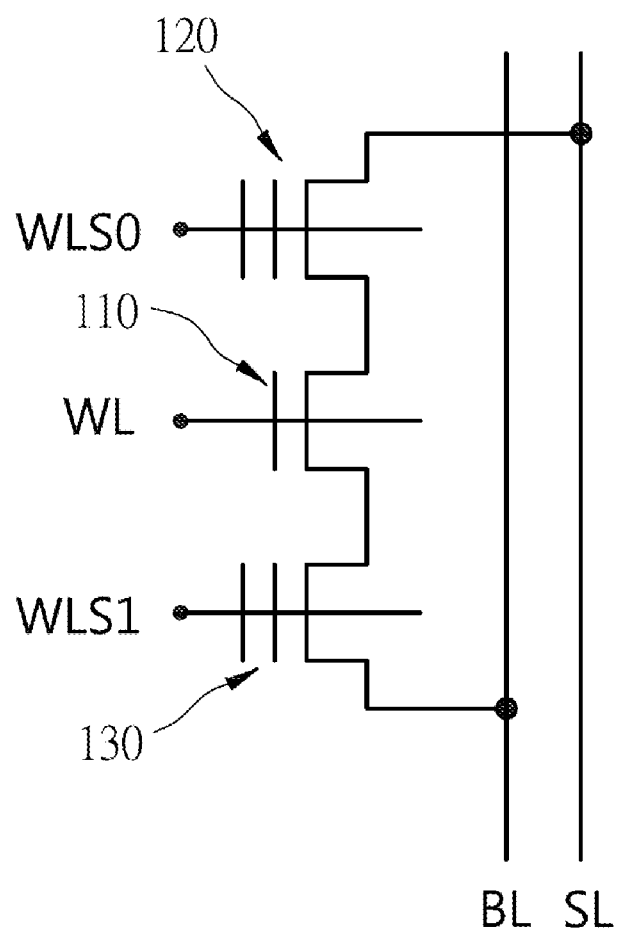
FIG. 2 is a schematic view of another two-bit memory cell structure according to the present invention.

The gate electrode of the select transistor 110 is connected to a word line WL; the gate electrodes of the first charge storage transistor 120 and the second charge storage transistor 130 on two sides of the select transistor are respectively connected to respective word lines WLS0 and WLS1; the drain side of the first charge storage transistor 120 and the source side of the second charge storage transistor 130 are respectively connected to the cell bit line (BL) and the cell source line (SL) while the source side of the first charge storage transistor 120 and the drain side of the second charge storage transistor 130 are respectively connected to the drain side and the source side of the select transistor. Alternatively, in a symmetric cell thereof, the drain side of the first charge storage transistor 120 and the source side of the second charge storage transistor 130 are respectively connected to the cell source line (SL) and the cell bit line (BL) while the source side of the first charge storage transistor 120 and the drain side of the second charge storage transistor 130 are respectively connected to the drain side and the source side of the select transistor (as shown in FIG. 2). In implementation application, the three transistors (3T) of the two-bit memory cell 100 have a symmetric structure, and the cell bit line (CL) and the cell source line (SL) can be completely exchanged as the drain side or the source side to apply voltage in left and right operation.

In implementation application, taking for example, the technology structure of the first and the second charge storage transistors 120 and 130 embodied by SONOS devices; the voltage implementation method of the two-bit memory cell 100 during write, erase and read operations is described. As shown in table 1, the first charge storage transistor 120 and the second charge storage transistor 130 on the word lines WLS0 and WLS1 in the same two-bit memory cell 100 perform write and read operations respectively separately, and perform erase operation together, wherein the operations on the first charge storage transistor 120 and the second charge storage transistor 130 are respectively represented with WLS0 and WLS1. In table 1, the front and back of the symbol "/" respectively represent: voltage bias condition of a selected cell and an unselected cell.

TABLE 1

| Operating mode | Read (WLS0) | Read (WLS1) | Erase | Write (WLS0) | Write (WLS1) |
|---|---|---|---|---|---|
| WL | VPWR/0 | VPWR/0 | VPWR/0 | VWL | VWL |
| WLS0 | 0 | Voverride/0 | VNEG/VPOS | VPOS/VNEG | VNEG/VNEG |
| WLS1 | Voverride/0 | 0 | VNEG/VPOS | VNEG/VNEG | VPOS/VNEG |
| BL | VLIM/0 | 0 | VPOS | VNEG/VBL | VNEG/VBL |
| SL | 0 | VLIM/0 | VPOS | VNEG/VBL | VNEG/VBL |
| P-Well | 0 | 0 | VPOS | VNEG | VNEG |

During write operation, a positive voltage $V_{POS}$ is applied to a target word line (WLS0 or WLS1) of the selected cell (two-bit memory cell 100); a negative voltage $V_{NEG}$ is applied to a P-well in the SONOS device; electrons are injected into the ONO layer in the device for storage by means of the FN tunnel penetration effect of the SONOS device; a negative voltage $V_{NEG}$ is applied to the unselected conjugated word line (WLS1 or WLS0) in the same cell and all the word lines (WLSk) of the unselected cells to remain an equilibrium voltage with the P well. In the process, the word line WL of the select transistor 110 in the selected cell keeps on by applying a positive voltage $V_{WL}$.

The voltages of erase operation and write operation are opposite: a negative voltage $V_{NEG}$ is applied to both the word lines WLS0 and WLS1 of the selected cell while the a positive voltage $V_{POS}$ is applied to the P well, and the SONOS device transfers the electrons out of the ONO layer and injects the electrons into the P well by means of the reverse FN tunnel penetration effect. The word lines WLS0 and WLS1 of the first and the second charge storage transistors 120 and 130 are applied with the same voltage, and the two transistors are simultaneously erased. In the process, the word line WL of the select transistor 110 in the selected cell keeps on or off by applying a positive voltage $V_{PWR}$.

During read operation, the bias voltage of the P well (P-Well) is set to be zero. The word line WL of the select transistor 110 in the unselected cell has a zero voltage, and keeps gate closed. In the two-bit memory cell 100 selected to read, a positive voltage $V_{PWR}$ is applied to the word line WL of the select transistor 110 to keep the select gate open allowing adequate currents to flow through; generally, assuming that the word line for reading the target charge storage transistor (the first charge storage transistor 120) is WLS0, and the word line of the conjugated storage transistor is WLS1; during the operation for reading WLS0, a positive voltage Voverride is applied to the WLS1 to override the charge storage transistor 130; no matter whether the second charge storage transistor 130 has charged or not, the transistor keeps on without influencing the read of the first charge storage transistor 120.

The selection range of the voltage value of the override voltage Voverride mentioned above is: greater than the value of the highest point in the threshold voltage (VT) distribution of the storage bits, and less than a half of the write voltage ($V_{POS}/2$). The second charge storage transistor 130 (WLS1) and the select transistor 110 (WL) both keep on; the bit line BL connected to the first charge storage transistor 120 (WLS0) is used as a drain electrode that is applied with an input voltage $V_{LIM}$; a source line (SL) connected to the second charge storage transistor 130 (WLS1) is used as a source electrode; applying a normal read voltage for the WLS0 (the voltage is approximately 0 V for the SONOS technology) allows the storage state of the storage transistor (the first charge storage transistor 120) corresponding to WLS0 to be read out according to the current of the bit line (BL). The storage state of the storage transistor (the second charge storage transistor 130) corresponding to WLS1 can be read out by means of the same read operation.

In the embodiment of the present invention, the memory cell array consisting of the two-bit memory cells 100, in cooperation with a two-stage readout circuit, can be applied in different neural network architectures to complete multiply accumulate (MAC) operation.

The circuit structure of the two-bit memory cell computing in memory of the present invention comprises a memory cell array consisting of the two-bit memory cells 100 for storing weights; in the memory cell array, all two-bit memory cells 100 on the same word line group (BL/SL) corresponds to connections of the same neural node, and the two-bit memory cells 100 on the same word line group (BL/SL) are connected in series.

For two weight memory transistors of each two-bit memory cell 100 in each column of the weight memory array, the gate electrodes of the first charge storage transistor 120 and the second charge storage transistor 130 are respectively connected to the signal line of a word line $CG_{2k}$ and the signal line of a word line $CG_{2k+1}$ while the gate electrode of the select transistor 110 in the middle is connected to a select signal line $SG_k$ (k=0, 1, 2, ... n). The charge storage transistors on the same word line signal line $CG_{2k}$ (or $CG_{2k+1}$) (the first charge storage transistors 120 or the second charge storage transistors 130) form a storage page, the same storage page stores the weights with the same sign, and all the storage pages are divided into two groups.

For the connecting line of each column of the weight memory array, an input terminal of the same bit line group (BL/SL) is connected to a high voltage (HV) page buffer circuit 200, which provides a signal input of voltage bias for the configuration of the weight array. For the connecting line of each column of the weight memory array, an output terminal of the same bit line group (BL/SL) is connected to an input terminal of a multiplexer 500 for decoding; an output terminal of the multiplexer 500 is connected to a two-stage readout circuit; the two-stage readout circuit comprises a charging capacitor, a current calculator (a current adder 320, a current subtracter 310, or a multiplication amplifier 330), and a current comparison amplifier 400.

According to differences in weight characteristics and algorithms of the applied neural networks, the embodiment of the present invention provides three different weight memory array schemes and three corresponding two-stage readout circuit implementation solutions.

In the scheme 1 provided in the embodiment of the present invention, the weight memory array consisting of the two-bit memory cells 100 and the corresponding readout circuits are applied for the MAC operation whose algorithm involve a neural network matrix with both positive and negative weights simultaneously.

Figure 3:
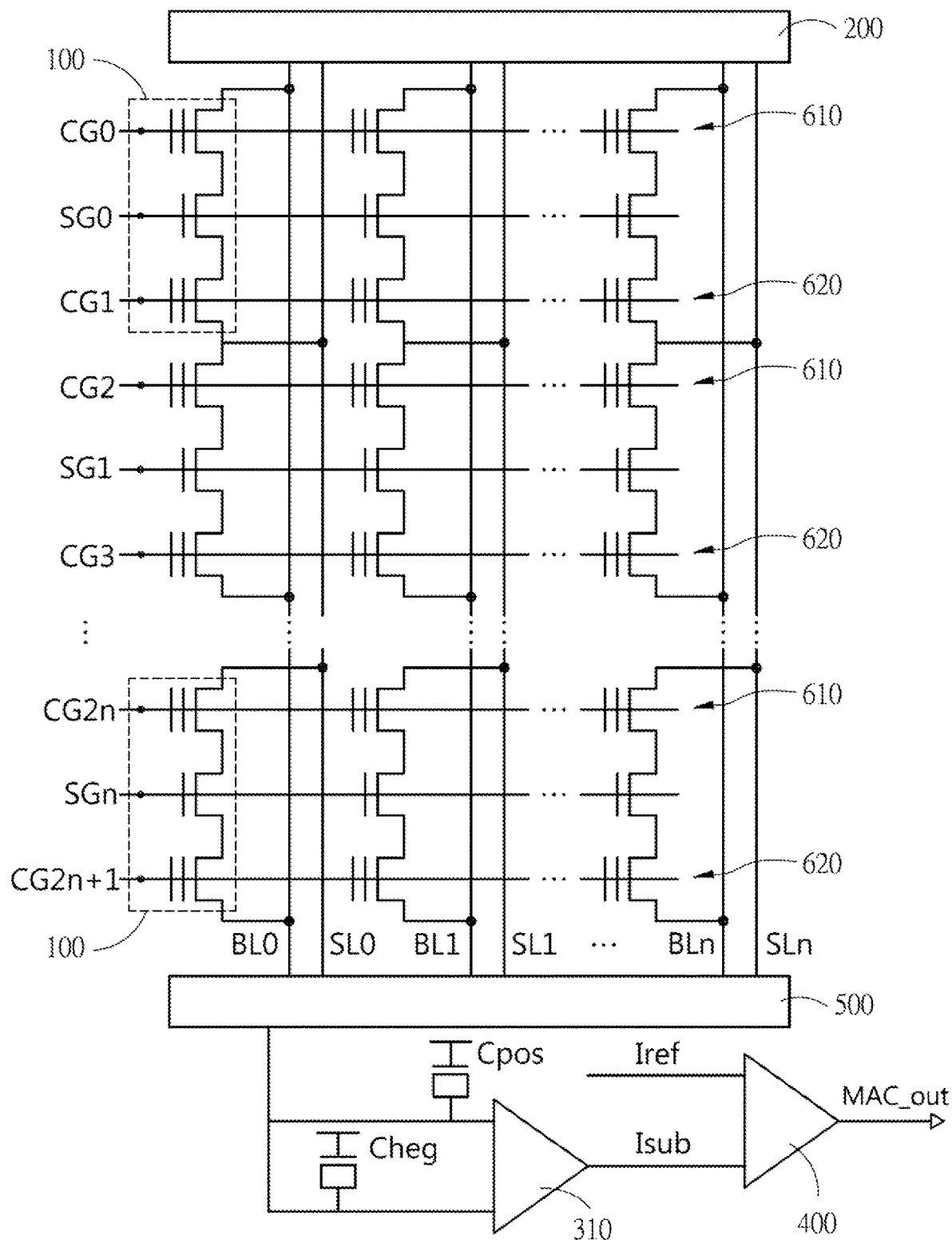
FIG. 3 is a schematic view of an in-memory computing circuit for storing positive and negative weights in the two-bit memory cell according to the present invention.

In such algorithms, the ratio of the positive weights to the negative weights is symmetric in most cases. FIG. 3 is a schematic view of an in-memory computing circuit for storing positive and negative weights in the two-bit memory cell according to the present invention. As shown in FIG. 3, the memory array architecture is designed to have 50% positive weights and 50% negative weights. In the architecture, the two storage transistors in the same two-bit memory cell 100 (the first charge storage transistor 120 and the second charge storage transistor 130) are respectively used to store positive and negative weights; the two-bit memory cells 100 on the same word line group (BL/SL) correspond to different connections of the same neural node. The charge storage transistors on the same word line signal line $CG_{2k}$ (or $CG_{2k+1}$) (the first charge storage transistors 120 or the second charge storage transistors 130) form a storage page, the same storage page stores the weights with the same sign, and all the storage pages are therefore divided into two groups, as the positive weight page group 610 and the negative weight page group 620 shown in FIG. 3. All the positive weight page group 610 and the negative weight page group 620 are controlled by means of a bias voltage of the high voltage page buffer circuit 200, and the absolute values of the weights are programmed into the two-bit memory cells 100 page by page with the above operating method for the two-bit memory cell 100.

During reading, all drain current outputs of the positive weight page group 610 and the negative weight page group 620 are connected to the multiplexer 500 for decoding, and the output terminal of the multiplexer 500 is detected with a two-step current detection method.

The first step is detecting the current (Iw_pos) of the positive weight page group 610 and storing charges in a capacitor Cpos and the second step is exchanging the drain electrode with the source electrode and detecting the current (Iw_neg) of all the negative weight page groups 620 and storing in another capacitor Cneg. After the detection in the second step, the two groups of currents flow through the current subtracter 310 which outputs a current difference Isub that is the comparison result between Iw_pos and Iw_neg. The current difference Isub and a reference current Iref are inputted together into the current comparison amplifier 400 to generate a digital output value MAC_out of the multiplier accumulator (MAC).

It should be pointed out that if the ratio of the positive weights to the negative weights in the algorithm is not symmetric, the storage architecture and the readout circuit structure proposed by the present solution are still valid, only that the positive weight page group or the negative weight page group has vacant pages (select word lines are not applied with voltage and the select gate does not open during reading) and the storage efficiency is reduced. If the ratio of the positive weights to the negative weights in the algorithm is seriously unbalanced, in order to improve the storage efficiency, some weight pages can be adjusted such that the two transistors in the same cell store all positive or all negative weights; accordingly, the readout circuit is also adjusted from two-step reading to three-step reading (the added step is separately used to read the weight pages the sign is changed within the group).

Figure 4:
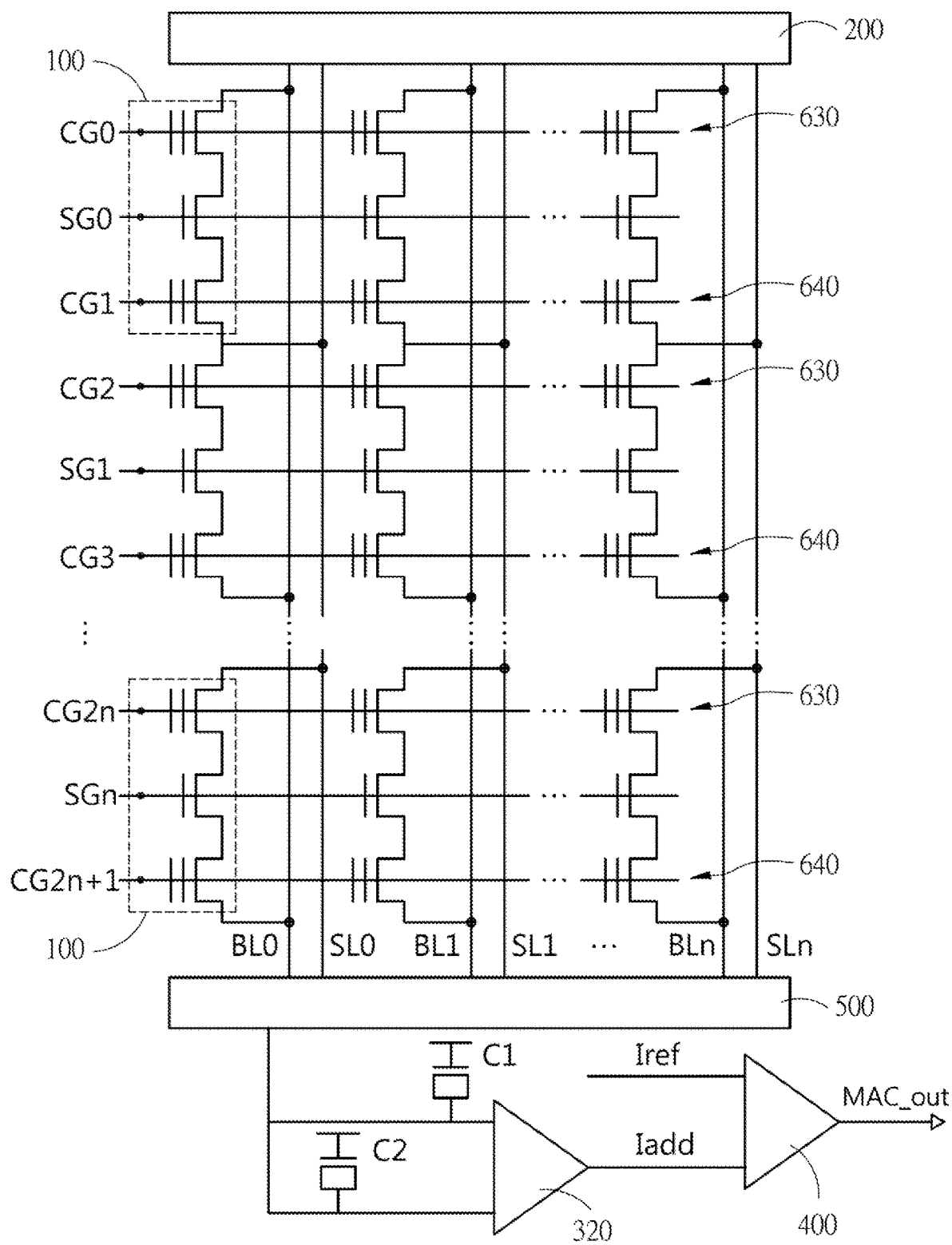
FIG. 4 is a schematic view of an in-memory computing circuit for storing all positive or all negative weights in the two-bit memory cell according to the present invention.

In the scheme 2 provided in the embodiment of the present invention, the weight memory array consisting of the two-bit memory cells 100 and the corresponding readout circuits are applied for the neural network matrix operation whose algorithm involve a neural network matrix with all positive or all negative weights simultaneously. Without loss of generality, the positive weights are taken as an example. FIG. 4 is a schematic view of an in-memory computing circuit for storing all positive or all negative weights in the two-bit memory cell according to the present invention. In the architecture, all the storage pages are used to store positive weights, and the weight storage pages can still be divided into two groups: a first weight page group 630 and a second weight page group 640. The word line signal lines $CG2k$ and $CG2k+1$ (k=0, 1, . . . n) of the two storage transistors in the same two-bit memory cell 100 (the first charge storage transistor 120 and the second charge storage transistor 130) are in different page groups.

The corresponding two-stage current readout circuit of the architecture also sequentially detects the currents of the first weight page group 630 and the second weight page group 640 (in which the drain electrode and the source electrode are exchanged) and stores charges in the capacitors C1 and C2 and then the currents are added by the current adder 320. The sum of the two currents Iadd and the reference current Iref are inputted together into the current comparison amplifier 400 to generate a digital output value MAC_out of the multiplier accumulator (MAC).

Figure 5:
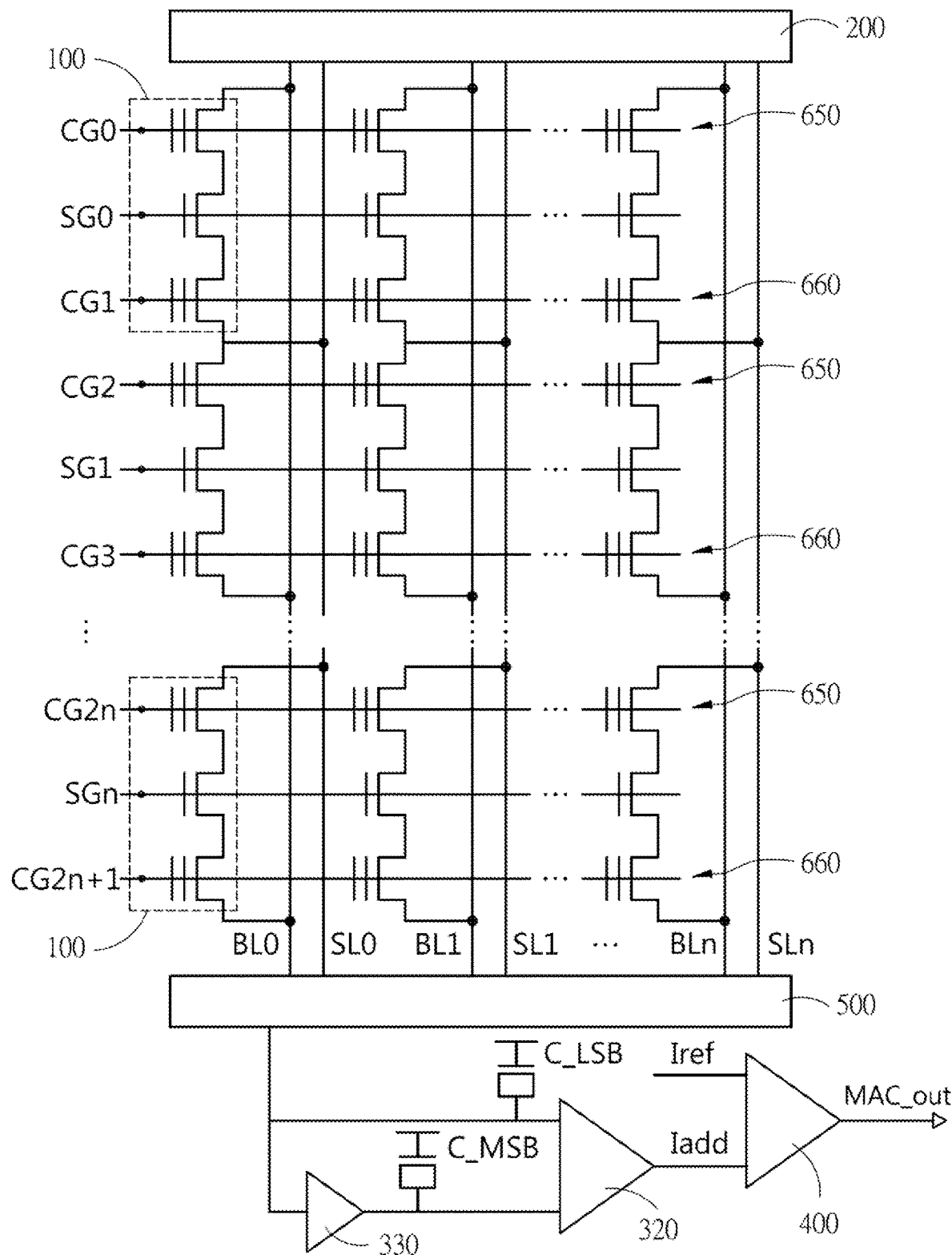
FIG. 5 is a schematic view of an in-memory computing circuit for storing upper-bits and lower-bits combined weights in the two-bit memory cell according to the present invention.

In the scheme 3 provided in the embodiment of the present invention, the weight memory array consisting of the two-bit memory cells 100 and the corresponding readout circuits are applied to the neural network matrix operation whose algorithm involve a neural network matrix with all positive or all negative long bit width weights simultaneously. FIG. 5 is a schematic view of an in-memory computing circuit for storing upper-bits and lower-bits combined weights in the two-bit memory cell according to the present invention. In the architecture, the weight storage pages are divided into two groups: an upper-bits weight storage page group 650 and a lower-bits weight storage page group 660. The word line signal lines $CG2k$ and $CG2k+1$ (k=0, 1, . . . n) of the two storage transistors in the same two-bit memory cell 100 (the first charge storage transistor 120 and the second charge storage transistor 130) are in different page groups, and are respectively used to store the upper bits and lower bits of the same weight.

Generally, for example, assuming that the first charge storage transistor 120 has a 16-layer energy level SONOS technology structure, then each one of the first charge storage transistors 120 can store 4 bits, and a pair of the first charge storage transistor 120 and the second charge storage transistor 130 in one two-bit memory cell 100 can store 8 bits weights. The corresponding two-stage current readout circuit in the architecture also sequentially detects the currents of the two weight groups (in which the drain electrode and the source electrode are exchanged). In the first step, the multiplication amplifier 330 amplifies upper-bits current (for example, by 16 times) and stores current charges in a capacitor C_MSB, and then detects lower-bits current and stores the current charges in another capacitor C_LSB, next, the current adder 320 adds the currents obtained from lower-bits and the amplified current from the upper-bits. The current sum Iadd and the reference current Iref are inputted together into the current comparison amplifier 400 to generate a digital output value MAC_out of the multiplier accumulator (MAC).

The present invention provides a two-bit memory cell structure and a circuit structure design for realizing an in-memory computing chip based on the structure, and the circuit is applicable for neural network operation. Compared with the conventional memory, the in-memory computing chip reduces the required data exchange between a CPU and an internal memory, and avoids the generation of intermediate data, thereby reducing the requirement for internal memory, reducing energy loss, reducing delay, and improving the overall performance of the chip. In order to realize high precision and high reliability during neural network computing, the present invention adopts a three-transistor two-bit cell structure, can prevent over-erase by means of the switch, namely the select transistor 110, can effectively control leakage currents of write, erase and read, thereby reducing weight storage and operation power consumption; furthermore, the present invention can precisely control energy level in writing, support multi-bit weight storage, thereby remarkably improving the output precision and reliability of the multiplier accumulator (MAC).

The memory array in the embodiment of the present disclosure adapts to the design of a neural network chip; the embodiment of the present disclosure can improve the density of the stored weight data by increasing the number of layers of the memory array, and can further increase the number of connections of the neural network on each unit of chip area. The artificial neural network having increasing the number of the connections can perform more complex operation; therefore, the artificial neural network can be used to more precisely predict or classify in real scenarios.

The terms "in one embodiment of the present application" and "in various embodiments" are repeatedly used. The terms generally do not refer to the same embodiment, but in some cases can also refer to the same embodiment. The words "comprise", "have" and "include" are synonyms, unless other meanings are stated in the context.

The descriptions above are only specific embodiments of the present application, but are not intended to limit the present application in any form. The present application is disclosed by means of the above embodiments which, however, are not used to limit the present application. A person skilled in the art can utilize the above technical content to make some changes or equivalent modifications without departing from the scope of the technical solution of the present application; and any simple variations and equivalent changes and modifications made to the embodiments on the basis of technical essence of the present application without departing from the content of the technical solution of the present application still all fall within the scope of the technical solution of the present application.

What is claimed is:

1. A circuit structure of a two-bit memory cell for in-memory computing, comprising:
    a memory cell array consisting of two-bit memory cell structures and used for storing a weight matrix of a neural network, and the two-bit memory cell comprises: three transistors connected in series, in which the middle transistor is a select transistor used as a switch, and a first charge storage transistor and a second charge storage transistor are symmetrically placed on two sides of the select transistor; the gate electrode of the select transistor is connected to a word line, the gate electrodes of the first charge storage transistor and the second charge storage transistor are connected to respective word lines, and the drain side of the first charge storage transistor and the source side of the second charge storage transistor are respectively connected to the cell bit line and the cell source line while the source side of the first charge storage transistor and the drain side of the second charge storage transistor are respectively connected to the drain side and the source side of the select transistor; wherein the first charge storage transistor and the second charge storage transistor perform write and read operations respectively separately, and perform erase operation simultaneously;
    each memory cell array is used to store weights of input signals of a layer of the neural network; the number of columns of the array corresponds to the number of nodes of the layer of the neural network; the memory cells in the same column of the array are used to store weights linked to the same neural node in the neural network from different input signal links of a previous layer; voltage signals on the word lines in the same row correspond to input signals from the previous layer; the memory cells in the same row but different columns correspond to weights of the signal from the same node of the previous layer linked to different neural nodes of current layer of the neural network;
    in the structure of the array, two-bit memory cells in the same column are connected in series; charge storage transistors on the same word line signal line in the same row are connected in parallel to form a storage page; the same storage page stores weights with the same sign, and all the storage pages are divided into two groups corresponding to the storage transistors in left and right sides of the memory cell; input terminals in the same column of the memory cell array are connected to a high voltage page buffer circuit so as to provide a signal input of voltage bias for the configuration and calling of a weight array corresponding to writing and reading the memory cell, and output terminals are connected to a multiplexer for performing decoding selection, in which an output terminal of the multiplexer is connected to a two-stage readout circuit, and the two-stage readout circuit comprises a charging capacitor, a current calculator, and a current comparison amplifier.

2. The circuit structure of a two-bit memory cell for in-memory computing according to claim 1, wherein the current calculator comprises one of a current adder, a current subtracter, a multiplication amplifier, and a combination thereof.

3. The circuit structure of a two-bit memory cell for in-memory computing according to claim 2, wherein in a neural network matrix operation adopting positive and negative weights, the output terminal of the multiplexer detects currents of all the positive weight page group and stores electric charges in a capacitor; and after a drain electrode and a source electrode are exchanged, the output terminal detects currents of all the negative weight page group and stores the currents in another capacitor; the current subtracter outputs a current difference between the two groups of currents, and the current difference and a reference current are inputted together into the current comparison amplifier to generate a digital output value of a multiplier accumulator.

4. The circuit structure of a two-bit memory cell for in-memory computing according to claim 2, wherein in a neural network matrix operation adopting all positive or all negative weights, the output terminal of the multiplexer detects currents of all the first weight page group and stores electric charges in a capacitor; and after a drain electrode and a source electrode are exchanged, the output terminal detects currents of all the second weight page group and stores the currents in another capacitor; the current adder outputs a current sum of the two groups of currents, and the current sum and a reference current are inputted together into the current comparison amplifier to generate a digital output value of a multiplier accumulator.

5. The circuit structure of a two-bit memory cell for in-memory computing according to claim 2, wherein in a neural network matrix operation adopting all positive or all negative long bit width weights, the output terminal of the multiplexer detects all the currents of an upper-bits weight storage page group amplified by the multiplication amplifier and stores electric charges in a capacitor; and after a drain electrode and a source electrode are exchanged, the output terminal detects all the currents of a lower-bits weight storage page group and stores the currents in another capacitor; the current adder outputs a current sum of the two groups of stored currents, and the current sum and a reference current are inputted together into the current comparison amplifier to generate a digital output value of a multiplier accumulator.

6. The circuit structure of a two-bit memory cell for in-memory computing according to claim 1, wherein the cell bit line and the cell source line are completely exchangeable during operation and form symmetric cells after exchange, in which the drain side of the first charge storage transistor and the source side of the second charge storage transistor are respectively connected to the cell source line and the cell bit line while the source side of the first charge storage transistor and the drain side of the second charge storage transistor are respectively connected to the drain side and the source side of the select transistor; any two-bit memory cell forms a pair of adjacent cell groups with the symmetric cells formed by exchanging.

7. The circuit structure of a two-bit memory cell for in-memory computing according to claim 1, wherein the first charge storage transistor and the second charge storage transistor are selected from the following storage transistor structures: a charge trapping ONO flash memory transistor structure, a floating gate flash memory structure transistor, a resistive random access memory, a magnetic random access memory, and a ferromagnetic random access memory.

8. The circuit structure of a two-bit memory cell for in-memory computing according to claim 7, wherein the first charge storage transistor and the second charge storage transistor are two-level or multi-level storage transistors.

9. The circuit structure of a two-bit memory cell for in-memory computing according to claim 7, wherein during write operation, a positive voltage is applied to a word line of a target charge storage transistor and a negative voltage is applied to a cell P well, and electrons are injected into a storage layer under a positive-negative voltage difference; a negative voltage is applied to the other charge storage transistor to remain an equilibrium electric potential with the P well; and a positive switching voltage is applied to the word line of the select transistor in the cell to keep the select transistor on.

10. The circuit structure of a two-bit memory cell for in-memory computing according to claim 7, wherein during erase operation, a negative voltage is applied to both the word lines of the first and the second charge storage transistors and a positive voltage is applied to the cell P well, and electrons are erased from the storage layers of the two storage transistors under the positive-negative voltage difference; in the process, the word line of the select transistor in the cell can be set to be on or off.

11. The circuit structure of a two-bit memory cell for in-memory computing according to claim 7, wherein during read operation, a positive voltage is applied to the bit line of the select transistor to keep the transistor on; a positive override voltage is applied to the word line of the charge storage transistor conjugated with the reading target charge storage transistor, so as to override the charge storage transistor; a voltage value of the positive override voltage is greater than the value of the highest point in the threshold voltage distribution of the storage bits, and is less than a half of the write voltage.

* * * * *